(12) United States Patent
Chua et al.

(10) Patent No.: US 9,190,433 B2
(45) Date of Patent: Nov. 17, 2015

(54) AMBIENT LIGHT SENSING WITH STACKED PHOTODIODE STRUCTURE WITH DUAL PN JUNCTION

(71) Applicant: LITE-ON SINGAPORE PTE. LTD., Midview (SG)

(72) Inventors: Seng-Yee Chua, Singapore (SG); John Julius De Leon Asuncion, Singapore (SG)

(73) Assignee: LITE-ON SINGAPORE PTE. LTD., Midview (SG)

( * ) Notice: Subject to any disclaimer, the term of this patent is extended or adjusted under 35 U.S.C. 154(b) by 430 days.

(21) Appl. No.: 13/845,177

(22) Filed: Mar. 18, 2013

(65) Prior Publication Data

US 2014/0263972 A1    Sep. 18, 2014

(51) Int. Cl.
H01L 31/00 (2006.01)
H01L 27/144 (2006.01)
H01L 31/103 (2006.01)
H01L 31/11 (2006.01)

(52) U.S. Cl.
CPC .......... H01L 27/1443 (2013.01); H01L 31/103 (2013.01); H01L 31/11 (2013.01)

(58) Field of Classification Search
CPC .... H01L 27/1443; H01L 31/103; H01L 31/11
USPC ......... 250/214.1, 214 R, 239, 208.1, 214 AL, 250/221, 338.1, 338.4; 257/290–292, 257/233–257, 401–444; 438/48–57, 438/302–311
See application file for complete search history.

(56) References Cited

U.S. PATENT DOCUMENTS 7,883,916 B2 * 2/2011 Gambino et al. ............... 438/48

* cited by examiner

Primary Examiner — Que T Le
(74) Attorney, Agent, or Firm — Li & Cai Intellectual Property (USA) Office (57) ABSTRACT

A stacked photodiode structure comprises a first-conductivity-type substrate, a second-conductivity-type well region and a first-conductivity-type well region. The first-conductivity-type substrate has a first surface for light incidence and a grounding terminal. The second-conductivity-type well region is formed in the first-conductivity-type substrate and adjacent to the first surface. The first-conductivity-type well region is formed in the second-conductivity-type well region and adjacent to the first surface. A PN junction between the first-conductivity-type well region and the second-conductivity-type well region generates free electrons responsive to visible light spectrum. A PN junction between the second-conductivity-type well region and the first-conductivity-type substrate generates free holes and free electrons responsive to mainly IR light. The difference between a first photocurrent generated from an anode terminal of the first-conductivity-type well region and a second photocurrent generated from a cathode terminal of the second-conductivity-type well region represents the intensity of incident IR light.

13 Claims, 5 Drawing Sheets

AMBIENT LIGHT SENSING WITH STACKED PHOTODIODE STRUCTURE WITH DUAL PN JUNCTION

BACKGROUND OF THE INVENTION

1. Field of the Invention

The instant disclosure relates to ambient light sensing with stacked photodiode; in particular, to a stacked photodiode for ambient light sensing and a photo sensor having the same.

2. Description of Related Art

Ambient light sensor (ALS) provides outputs that approximate human eye response. It is useful in display brightness management with the purpose of extending mobile battery life and providing optimum viewing experience in diverse indoor and outdoor lighting conditions.

Existing ambient light sensor is implemented in the following ways. Firstly, a single photodiode with coating to emulate human eye response. Secondly, dual diodes with one responsive visible light and infrared (IR) light spectrum, and the other responsive to mainly IR light spectrum, and emulate human eye response based on their difference. However, the earlier has higher manufacturing cost due to additional coating process and it is quite challenging to detect sub-lux lighting condition, while the later has occupied double silicon area and part to part variation is highly depends on how well the dual diodes were matched.

SUMMARY OF THE INVENTION

The object of the instant disclosure is to offer a stacked photodiode structure and a photo sensor having the same.

In order to achieve the aforementioned objects, according to an embodiment of the instant disclosure, a stacked photodiode structure is offered. The stacked photodiode structure comprises a first-conductivity-type substrate, a second-conductivity-type well region and a first-conductivity-type well region. The first-conductivity-type substrate has a first surface and a grounding terminal. The second-conductivity-type well region is formed in the first-conductivity-type substrate and adjacent to the first surface. The first-conductivity-type well region is formed in the second-conductivity-type well region and adjacent to the first surface. A first PN junction between the first-conductivity-type well region and the second-conductivity-type well region generates a first photocurrent that is responsive mainly to visible light spectrum incident from the first surface into the stacked photodiode structure. A second PN junction between the second-conductivity-type well region and the first-conductivity-type substrate generates a second photocurrent that is responsive mainly to IR light spectrum incident from the first surface into the stacked photodiode structure. The first photocurrent is collected from the terminal of the first-conductivity-type well region and the second photocurrent is collected from the terminal of the second-conductivity-type well region.

In order to achieve the aforementioned objects, according to an embodiment of the instant disclosure, a photo sensor is offered. The photo sensor comprises a stacked photodiode structure, a first charge balancing ADC (analog-to-digital converter), a second charge balancing ADC and a control circuit. The stacked photodiode structure comprises a first-conductivity-type substrate, a second-conductivity-type well region and a first-conductivity-type well region. The first-conductivity-type substrate has a first surface and a grounding terminal. The second-conductivity-type well region is formed in the first-conductivity-type substrate and adjacent to the first surface. The first-conductivity-type well region is formed in the second-conductivity-type well region and adjacent to the first surface. A first PN junction between the first-conductivity-type well region and the second-conductivity-type well region generates a first photocurrent that is responsive mainly to visible light spectrum incident from the first surface into the stacked photodiode structure. A second PN junction between the second-conductivity-type well region and the first-conductivity-type substrate generates a second photocurrent that is responsive mainly to IR light incident from the first surface into the stacked photodiode structure. The first photocurrent is provided from the terminal of the first-conductivity-type well region and the second photocurrent is generated from the terminal of the second-conductivity-type well region. The first charge balancing ADC has a first capacitor and is coupled to the terminal of the first-conductivity-type well region. The first charge balancing ADC receives the first photocurrent and converting the first photocurrent to a first voltage. The first charge balancing ADC has a first discharging reference current that is in opposite current flow direction than the first photocurrent to charge the first capacitor back to original predefined biasing voltage level. The second charge balancing ADC has a second capacitor and is coupled to the terminal of the n-type well region. The second charge balancing ADC receives the total sum of the photocurrent generated by the first PN junction and the second PN junction, and converting the total sum of the photocurrent to a second voltage. The control circuit is coupled to the first balancing ADC and the second balancing ADC. The second charge balancing ADC has a second discharging reference current that is in opposite current flow direction than the second photocurrent to discharge the second capacitor back to original predefined biasing voltage level. The control circuit receives the first voltage and the second voltage and controls the first charge balancing ADC to de-integrate the first voltage from a bias voltage to a first threshold voltage less than the bias voltage with the first photocurrent that is responsive mainly to visible light spectrum and then charges the first capacitor until the first voltage is equal to the bias voltage with predetermined reference current and estimates the charging time of the first capacitor responsive to the first photocurrent. The control circuit controls the second charge balancing ADC to integrate the second voltage from the bias voltage to a second threshold voltage larger than the bias voltage with the total sum of the photo current generated by the first PN junction and the second PN junction and then discharges the second capacitor until the second voltage is equal to the bias voltage with predetermined reference current and estimates the discharging time of the second capacitor responsive to the second photocurrent.

In summary, the stacked photodiode structure and the photo sensor having the same realize ambient light sensing without coating process on top of the photodiode provides lower cost and better performance stability. The stacked photodiode structure get rid of coating process and eliminate part to part variation due to critical matching requirement on the two independent diodes. The stacked photodiode structure could reduce photodiode area consumption while maintaining identical performance.

In order to further the understanding regarding the instant disclosure, the following embodiments are provided along with illustrations to facilitate the disclosure of the instant disclosure.

DETAILED DESCRIPTION OF THE PREFERRED EMBODIMENTS

The aforementioned illustrations and following detailed descriptions are exemplary for the purpose of further explaining the scope of the instant disclosure. Other objectives and advantages related to the instant disclosure will be illustrated in the subsequent descriptions and appended drawings.

Figure 1:
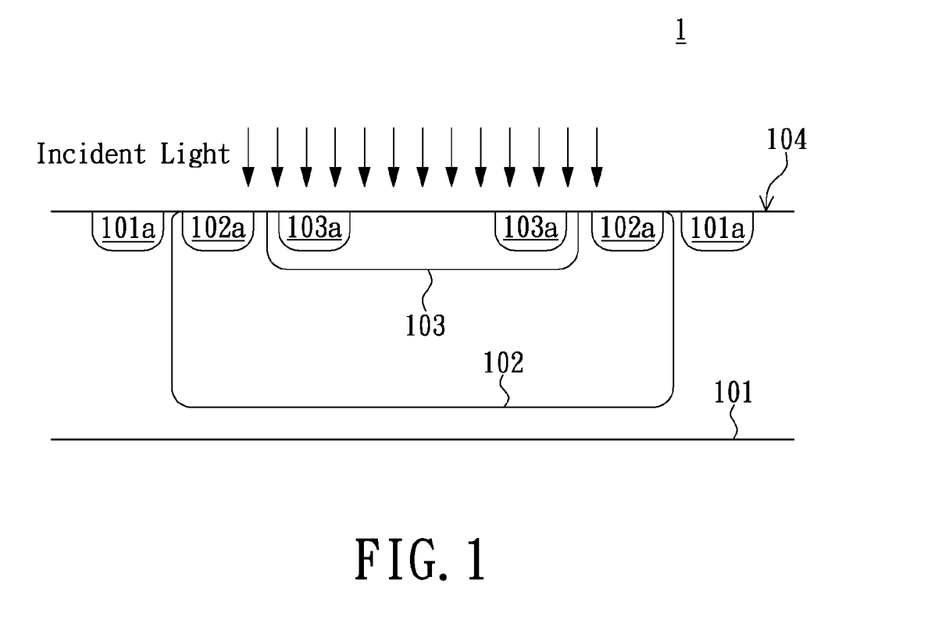
FIG. 1 shows a cross-sectional diagram of a stacked photodiode according to an embodiment of the instant disclosure.

FIG. 1 illustrates the cross-sectional diagram of the stacked photodiode. The stacked photodiode structure 1 comprises a first-conductivity-type substrate 101, a second-conductivity-type well region 102 and a first-conductivity-type well region 103. The first conductive type may be p-type or n-type, meanwhile the second conductive type may be n-type or p-type respectively. For example, when the first conductive type is p-type and the second conductive type is n-type, the first-conductivity-type 101 is p-type substrate, the second-conductivity-type well region 102 is n-type well region (i.e. NWell) and the first-conductivity-type well region 103 is p-type well region (i.e. PWell). In the same way, when the first conductive type is n-type and the second conductive type is p-type, the first-conductivity-type 101 is n-type substrate, the second-conductivity-type well region 102 is PWell and the first-conductivity-type well region 103 is NWell.

The first-conductivity-type substrate 101 has a first surface 104 and a grounding terminal 101a (two grounding terminals 101a shown in FIG. 1). The second-conductivity-type well region 102 is formed in the first-conductivity-type substrate 101 and adjacent to the first surface 104. A first PN junction J1 between the first-conductivity-type well region 103 and the second-conductivity-type well region 102 generates free electrons responsive to visible light incident from the first surface 104 into the stacked photodiode structure 1. The first-conductivity-type well region 103 is formed in the second-conductivity-type well region 102 and adjacent to the first surface 104. A second PN junction J2 between the second-conductivity-type well region 102 and the first-conductivity-type substrate 101 generates free electrons responsive to IR light incident from the first surface 104 into the stacked photodiode structure 1. Free holes that are generated from PN junction J1 by photoelectric effect will be collected at the terminal 103a (two terminals 103a shown in FIG. 1) of the first-conductivity-type well region 103, hence generating the first photocurrent that is responsive to mainly visible light spectrum. Free electrons that are generated from PN junction J1 and J2 by photoelectric effect will be collected at the terminal 102a of the second-conductivity-type well region 102, hence generating the second photocurrent that is responsive to both visible light and IR light spectrum.

The grounding terminal 101a may comprise at least a heavy doped p-type region formed in the p-type substrate 101 and adjacent to the first surface 104 of the p-type substrate 104 shown in FIG. 1. The cathode terminal 102a of the n-type well region 102 may comprise at least a heavy doped n-type region formed in the n-type well region 102 and adjacent to the first surface 104 of the p-type substrate 101. The anode terminal 103a of the p-type well region 103 may comprise at least a heavy doped p-type region formed in the p-type well region 103 and adjacent to the first surface 104 of the p-type substrate 101. However, the instant disclosure is not restricted thereto. The grounding terminal 101a, cathode terminal 102a and anode terminal 103a may be any kind of ohmic contact terminal, such as metal terminals. A skilled person in the art will appreciate the implementation manner of these terminals, thus there is no need to go into details.

Figure 2:
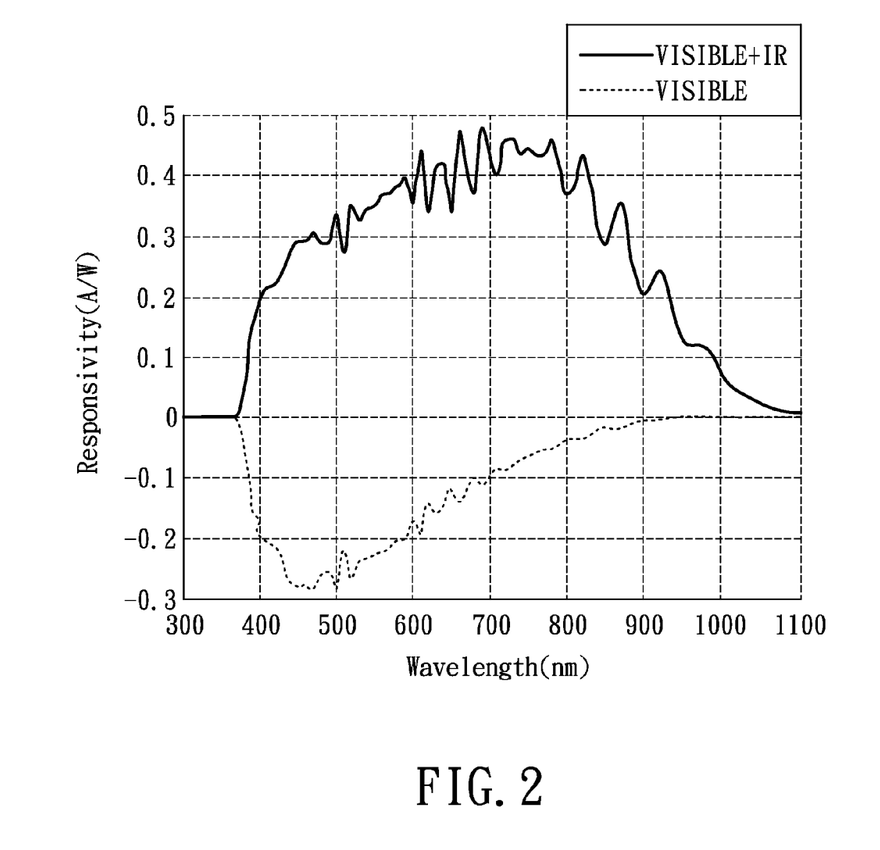
FIG. 2 shows a curve diagram of the responsivity varies with light wavelength of a stacked photodiode according to an embodiment of the instant disclosure.

FIG. 2 shows a curve diagram of the responsivity varies with light wavelength of a stacked photodiode according to an embodiment of the instant disclosure. With the described photodiode construction, two photodiodes are stacked vertically to produce two photocurrents that one sensitive mainly to visible light, and the other sensitive to both visible and IR light (e.g. IR light mainly) as shown in FIG. 2. The negative responsivity as shown in FIG. 2 represents the generated photocurrent is in opposite polarity.

Figure 3:
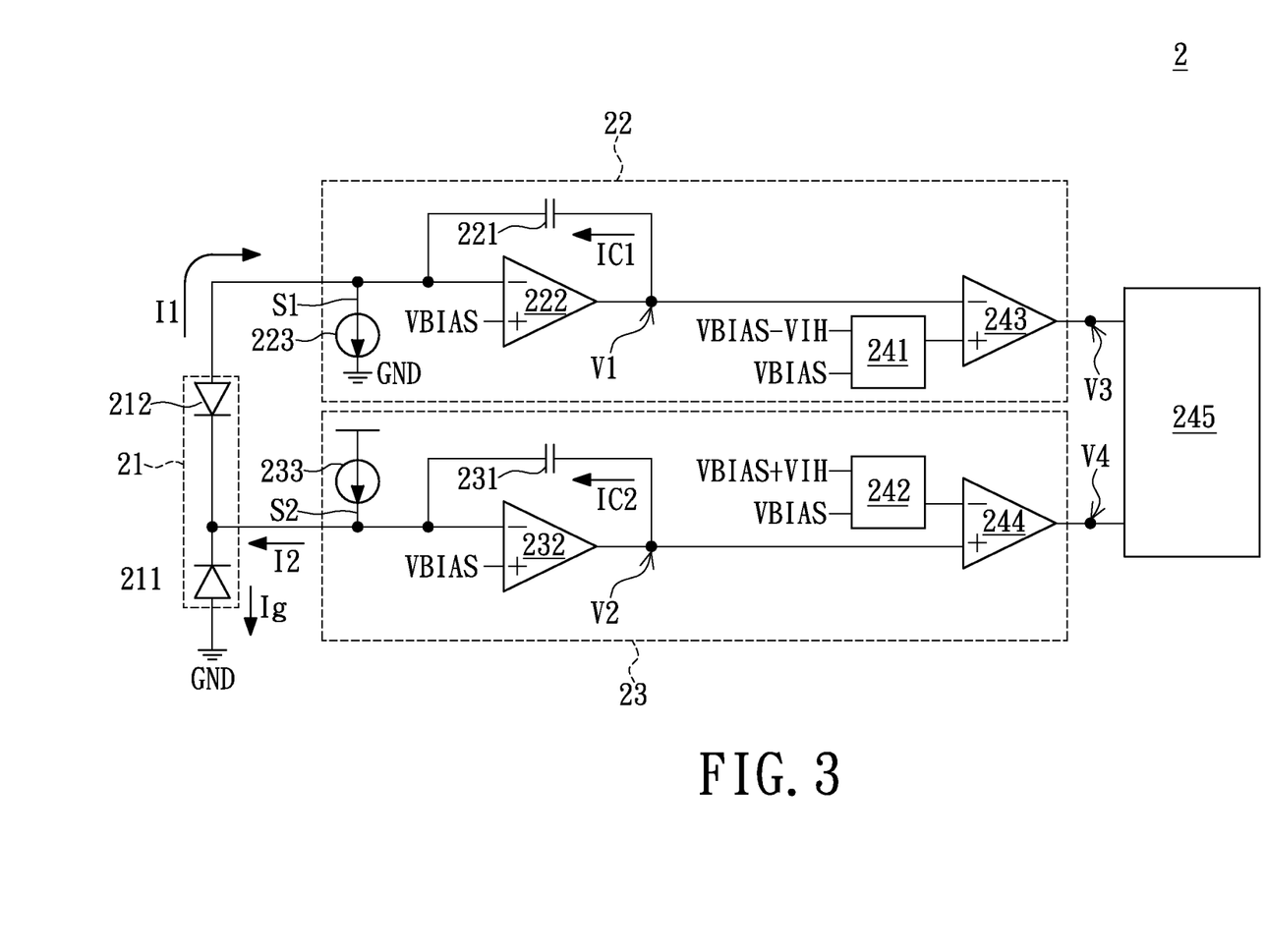
FIG. 3 shows a block diagram of a photo sensor with a stacked photodiode according to an embodiment of the instant disclosure.

Referring to FIG. 3 showing a block diagram of a photo sensor with a stacked photodiode according to an embodiment of the instant disclosure. The circuit construction integrating with the stacked photodiode to convert the photocurrents to voltage level and then to digital codes. The photo sensor 2 comprises a stacked photodiode structure 21, a first charge balancing ADC (analog-to-digital converter) 22, a second charge balancing ADC 23 and a control circuit 245. The stacked photodiode structure 21 may be the same as to the stacked photodiode structure 1, meanwhile the diode 211 represents the combination of first-conductivity-type substrate 101, second PN junction J2 and second-conductivity-type well 102, and the diode 212 represents the combination of second-conductivity-type well 102, the first PN junction J1 and the first-conductivity-type well 103. The grounding terminal 101a of the first-conductivity-type substrate 101 is connected to the ground GND.

The first charge balancing ADC 22 has a first capacitor 221 and is coupled to the anode terminal 103a of the first-conductivity-type well region 103 (i.e. the anode of the diode 212). The second charge balancing ADC 23 has a second capacitor 231 and is coupled to the cathode terminal 102a of the second-conductivity-type well region 102 (i.e. the cathode of the diode 211). The control circuit 245 is coupled to the first balancing ADC 22 and the second balancing ADC 23.

The first charge balancing ADC 22 receives the first photocurrent I1 and converting the first photocurrent I1 to a first voltage V1. More specifically, the first photocurrent I1 discharge the first capacitor 221 to the first voltage V1. The second charge balancing ADC 23 receives the second photocurrent I2 and converting the second photocurrent I2 to a second voltage V2. More specifically, the second photocurrent I2 charge the second capacitor 231 to the second voltage V2. The control circuit 245 receives the third voltage V3 and the fourth voltage V4 and controls the first charge balancing ADC 22 to de-integrate the first voltage V1 from a bias voltage VBIAS to a first threshold voltage (VBIAS−VTH) less than the bias voltage VBIAS with a predetermined threshold voltage VTH. Then, the control circuit 245 integrates the first capacitor 221 back to the first voltage V1 is equal to the bias voltage VBIAS by current source 223 and estimates the charging time T1 of the first capacitor 221 responsive to the first photocurrent. The control circuit 245 controls the second charge balancing ADC 23 to integrate the second voltage V2 from the bias voltage VBIAS to a second threshold voltage (VBIAS+VTH) larger than the bias voltage VBIAS with the predetermined threshold voltage VTH. Then, the control circuit 245 disintegrates the second capacitor 231 back to the second voltage V2 is equal to the bias voltage VBIAS by current source 233 and estimates the discharging time T2 of the second capacitor 231 responsive to the second photocurrent I2.

The second photocurrent I2 flows to both photodiodes 211 and 212, represents the photocurrent that is responsive to both visible and IR light. The first photocurrent I1 flows from the photodiode 212, represents the photocurrent that is responsive mainly to visible light. Current I1 is also a portion of current I2 after subtracting the current Ig that flowing to the photodiode 211.

Specifically, the first charge balancing ADC 22 further comprises an operational amplifier 222, a current source 223, a first multiplexer 241 and a first comparator 243. The operational amplifier 222 has an inverted input terminal, a non-inverted input terminal and an output terminal. The non-inverted input terminal receiving the bias voltage VBIAS. The current source 223 is coupled to the inverted input terminal of the operational amplifier 222 and controlled by the control circuit 245 to provide a reference current IREF for charging the first capacitor 221. The first capacitor 221 is coupled between the inverted input terminal and the output terminal of the operational amplifier 222 for establishing a feedback path. The first multiplexer 241 selectively provides the bias voltage VBIAS or the first threshold voltage VBIAS−VTH as a first comparing reference signal. The first comparator 243 compares the first voltage V1 with the first comparing reference signal and outputs a first comparing signal V3.

The second charge balancing ADC 23 further comprises an operational amplifier 232, a current source 233, a second multiplexer 242 and a second comparator 244. The operational amplifier 232 has an inverted input terminal, an non-inverted input terminal and an output terminal, the non-inverted input terminal receives the bias voltage VBIAS. The current source 233 is coupled to the inverted input terminal of the operational amplifier 232 and controlled by the control circuit 245 to provide a reference current IREF for discharging the second capacitor 231. The second capacitor 231 is coupled between the inverted input terminal and the output terminal of the operational amplifier 232 for establishing a feedback path. The second multiplexer 242 selectively provides the bias voltage VBIAS or the second threshold voltage VBIAS+VTH as a second comparing reference signal. The second comparator 244 compares the second voltage V2 with the second comparing reference signal and outputs a second comparing signal V4.

The control circuit 245 may be a digital control unit. The digital control circuit 245 receives the first comparing signal V3 and the second comparing signal V4 and controls the first multiplexer 241 and the second multiplexer 242, and controls the integration/de-integration time of the first charge balancing ADC 22 and the second charge balancing ADC 23.

The reference current IREF of the current sources 223 represents the maximum detectable of the second photocurrent I2 that is in opposite polarity with the first photocurrent I1 (at the node of the inverted input terminal of the operational amplifier 222). The reference current IREF can be of multiple current levels that can be programmed by users as part of adjusting the sensor sensitivity level. The current IREF of the current sources 233 represents the maximum possible of the second photocurrent I2 that is in opposite polarity with the second photocurrent I2 (at the node of the inverted input terminal of the operational amplifier 232). The second capacitor 231 could be charged by the second photocurrent I2 and discharged by current source 233 (having the reference current IREF) to operate as a charge balancing ADC. Similarly, the first capacitor 221 could be discharged by the first photocurrent I1 and charged by the current source 223 (having the current IREF) to operate as a charge balancing ADC.

Figure 4:
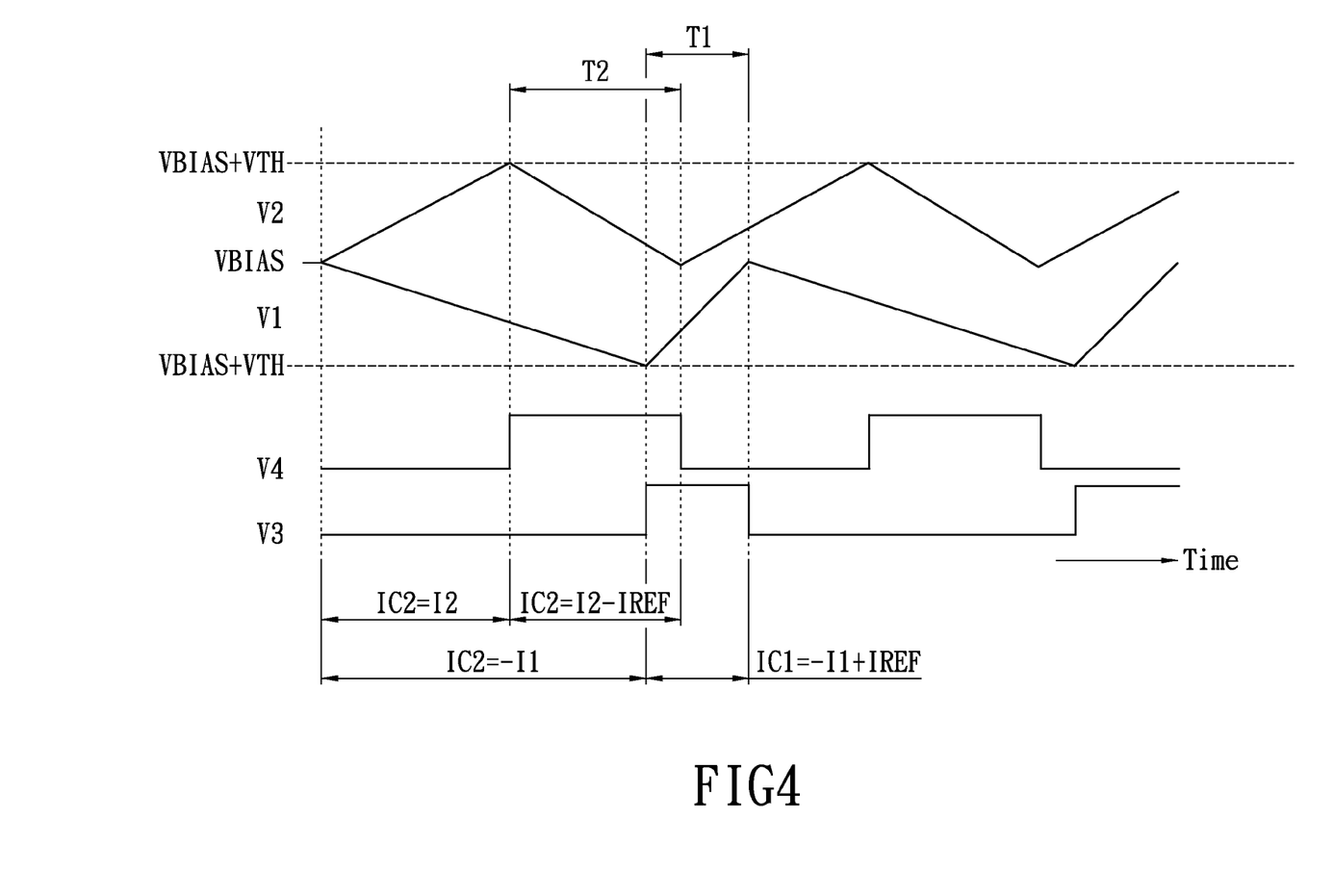
FIG. 4 shows a curve diagram of a photo sensor according to an embodiment of the instant disclosure.

FIG. 4 shows the waveform of integrator outputs comprising the first voltage V1 and the second voltage V2, and comparator outputs comprising the first comparing signal V3 and the second comparing signal V4. The integrator means the operational amplifier 222 (or 232) connected with the first capacitor 221 (or the second capacitor 231) as a feedback path.

The second capacitor 231 is charged by the second photocurrent I2 with respect to VBIAS up to a voltage VBIAS+VTH where the comparator output V4 becomes logic HIGH. The digital control circuit 245 senses the logic HIGH, and switches the comparing reference voltage from VBIAS+VTH to VBIAS via the multiplexer 242. This is to ensure the comparator output V4 remains as logic HIGH throughout entire discharging cycle. At this time, the current source 233 would be turned on (through a switch S2), and a counter (not shown in FIG. 3) of the digital control circuit 245 starts counting (referring to a discharging time T2 shown in FIG. 4) when the capacitor 231 is discharged by current I2−IREF, until back to the bias voltage VBIAS. When the second voltage V2 back to the bias voltage VBIAS, the comparator output V4 goes LOW, comparing reference voltage switch back to VBIAS+VTH, the current source 233 is turned OFF (through the switch S2) and the counter stop counting. The next charging and discharging cycle repeats again until a specified integrating time has reached, in which the counter value is proportional to the second photocurrent I2. The logic of V4 can be inverted or just a pulse generation at each of the integration and de-integration transition phase, as long as there are understood by the counters in the control circuit 245 that to continue do counting whenever the reference current source 233 is ON.

Similar process applied to integrator (operational amplifier 222 and the first capacitor 221) and the second comparator 243. Since the first photocurrent I1 and the second photocurrent I2 are in opposite polarity, the capacitor 221 would start to discharge with respect to reference voltage VBIAS by the first photocurrent I1 down to a voltage VBIAS−VTH where the comparator output V3 becomes logic HIGH. The digital control circuit 245 senses the logic HIGH, and switches the comparing reference voltage from VBIAS−VTH to VBIAS via the multiplexer 241. This is to ensure the comparator output V3 remains as logic HIGH throughout entire charging cycle. At this time, the current source 223 would be turned on (through the switch S1), and the counter of the digital control circuit 245 could start counting when the first capacitor 221 is charged by current −I1+IREF, until back to the bias voltage VBIAS. When the first voltage V1 goes back to the bias voltage VBIAS, the comparator output voltage V3 goes LOW, comparison reference voltage switch back to VBIAS−VTH, the current source 223 is turned OFF and the counter stop counting. The discharging and charging cycle repeats again until the same specified integration time has reached, in which the counter value is proportional to the first photocurrent I1. The logic of V3 can be inverted or just a pulse generation at each of the integration and de-integration transition phase, as long as there are understood by the counters in the control circuit 245 that to continue do counting whenever the reference current 223 is ON.

Figure 5:
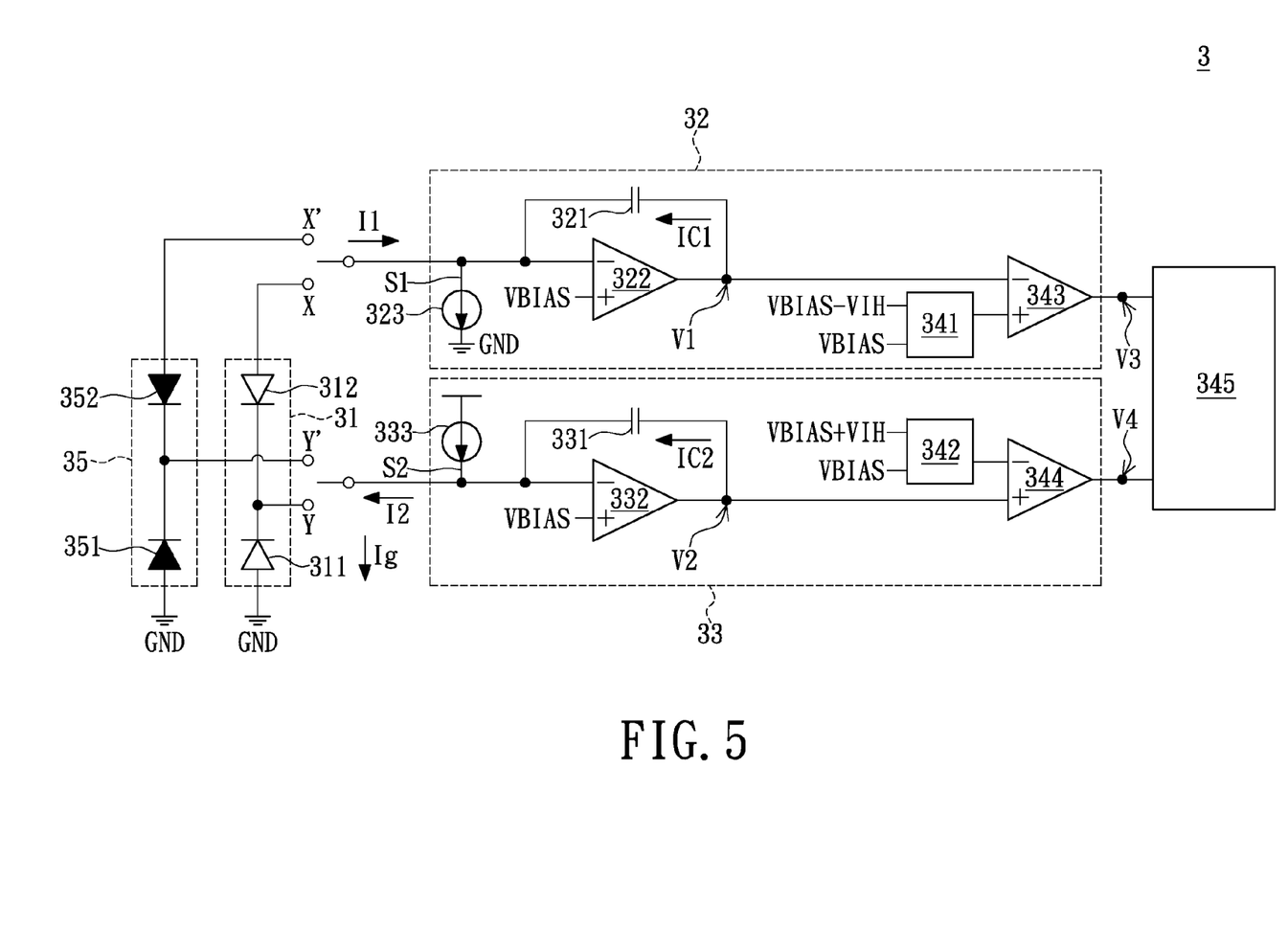
FIG. 5 shows a block diagram of a photo sensor with a stacked photodiode according to another embodiment of the instant disclosure.

As illustrated in FIG. 5, another embodiment shows another stacked photodiode structure, so called a dark stacked photodiode structure 35, being added. The photo sensor 3 comprises a stacked photodiode structure 31, a dark stacked photodiode structure 35, a first charge balancing ADC 32, a second charge balancing ADC 33 and a control circuit 345.

The stacked photodiode structure 31 may be the same as to the stacked photodiode structure 1 (shown in FIG. 1), meanwhile the diode 311 represents the combination of the first-conductivity-type substrate 101, the second PN junction J2 and the second-conductivity-type well region 102, and the diode 312 represents the combination of the second-conductivity-type well 102, the first PN junction J1 and the first-conductivity-type well 103.

The first charge balancing ADC 32 has a first capacitor 321 and is coupled to the anode 103a of the first-conductivity-type well region 103 (i.e. the anode of the diode 312). The second charge balancing ADC 33 has a second capacitor 331 and is coupled to the cathode 102a of the second-conductivity-type well region 102 (i.e. the cathode of the diode 311). The control circuit 345 is coupled to the first balancing ADC 32 and the second balancing ADC 33. The first charge balancing ADC 32, the second charge balancing ADC 33 and the control circuit 345 may be the same as to the first charge balancing ADC 22, the second charge balancing ADC 23 and the control circuit 245 respectively shown in FIG. 3, thus the redundant information is not repeated.

The dark stacked photodiode structure 35 may be fully covered by a metal layers to block all incident light while generating equivalent dark current to compensate with the actual stacked photodiode, so that to achieve better sensing accuracy especially at high ambient temperature and low ambient light environment. The dark anode terminal X' of the dark stacked photodiode structure 35 is coupled to the anode terminal X of the stacked photodiode structure 31. A dark cathode terminal Y' of the dark stacked photodiode structure 35 is coupled to the cathode terminal Y of the stacked photodiode structure 31.

The stacked photodiode structure and the photo sensor having the same in this disclosure eliminates the need of using multiple photodiodes placed side by side to approximate human eye response. This could reduce the photodiode area by half and eliminates the critical need of matching all the photodiodes.

The descriptions illustrated supra set forth simply the preferred embodiments of the instant disclosure; however, the characteristics of the instant disclosure are by no means restricted thereto. All changes, alternations, or modifications conveniently considered by those skilled in the art are deemed to be encompassed within the scope of the instant disclosure delineated by the following claims.

What is claimed is:

1. A stacked photodiode structure, comprising:
   a first-conductivity-type substrate, having a first surface and a grounding terminal;
   a second-conductivity-type well region, formed in the first-conductivity-type substrate and adjacent to the first surface; and
   a first-conductivity-type well region, formed in the second-conductivity-type well region and adjacent to the first surface;
   wherein a first PN junction between the first-conductivity-type well region and the second-conductivity-type well region generates free electrons responsive to mainly visible light spectrum incident from the first surface into the stacked photodiode structure;
   wherein a second PN junction between the second-conductivity-type well region and the first-conductivity-type substrate generates free holes and free electrons responsive to mainly IR light spectrum incident from the first surface into the stacked photodiode structure.

2. The stacked photodiode structure according to claim 1, wherein a first photocurrent is collected from the first-conductivity-type well region and a second photocurrent is collected from the second-conductivity-type well region, wherein the first photocurrent is mainly responsive to visible light spectrum and the second photocurrent is responsive to both visible and IR light spectrum.

3. The stacked photodiode structure according to claim 1, wherein the grounding terminal comprises at least a heavy doped first-conductivity-type region formed in the first-conductivity-type substrate and adjacent to the first surface of the first-conductivity-type substrate.

4. The stacked photodiode structure according to claim 1, wherein the cathode/anode terminal of the second-conductivity-type well region comprises at least a heavy doped second-conductivity-type region formed in the second-conductivity-type well region and adjacent to the first surface of the first-conductivity-type substrate.

5. The stacked photodiode structure according to claim 1, wherein the anode/cathode terminal of the first-conductivity-type well region comprises at least a heavy doped first-conductivity-type region formed in the first-conductivity-type well region and adjacent to the first surface of the first-conductivity-type substrate.

6. The stacked photodiode structure according to claim 1, wherein the first-conductivity-type is p-type, and the second-conductive-type is n-type.

7. The stacked photodiode structure according to claim 1, wherein the first-conductivity-type is n-type, and the second-conductive-type is p-type.

8. A photo sensor, comprising:
   a stacked photodiode structure, comprising:
      a first-conductivity-type substrate, having a first surface and a grounding terminal;
      a second-conductivity-type well region, formed in the first-conductivity-type substrate and adjacent to the first surface; and
      a first-conductivity-type well region, formed in the second-conductivity-type well region and adjacent to the first surface;
      wherein a first PN junction between the first-conductivity-type well region and the second-conductivity-type well region generates free electrons responsive to mainly visible lightspectrum from the first surface into the stacked photodiode structure; and
      wherein a second PN junction between the second-conductivity-type well region and the first-conductivity-type substrate generates free holes and free electrons responsive to mainly IR light spectrum incident from the first surface into the stacked photodiode structure;
      wherein a first photocurrent is collected from an anode terminal of the first-conductivity-type well region that is mainly responsive to visible light spectrum, and a second photocurrent is collected from a cathode terminal of the second-conductivity-type well region that is responsive to both visible and IR light spectrum;
   a first charge balancing ADC (analog-to-digital converter), having a first capacitor, coupling to the anode/cathode of the first-conductivity-type well region, receiving the first photocurrent and converting the first photocurrent to a first voltage;
   a second charge balancing ADC, having a second capacitor, coupling to the cathode/anode of the second-conductivity-type well region, receiving the second photocurrent and converting the second photocurrent to a second voltage; and
   a control circuit, coupling to the first balancing ADC and the second balancing ADC, receiving the first voltage and the second voltage, controlling the first charge balancing ADC to de-integrate the first voltage from a bias voltage to a first threshold voltage less than the bias voltage with a predetermined voltage and then charging the first capacitor until the first voltage is equal to the bias voltage and estimating the charging time of the first capacitor responsive to the first photocurrent, controlling the second charge balancing ADC to integrate the second voltage from the bias voltage to a second threshold voltage larger than the bias voltage with the predetermined voltage and then discharging the second capacitor until the second voltage is equal to the bias voltage and estimating the discharging time of the second capacitor responsive to the second photocurrent.

9. The photo sensor according to claim 8, wherein the first charging balancing ADC further comprising:

an operational amplifier, having an inverted input terminal, an non-inverted input terminal and an output terminal, the non-inverted input terminal receiving the bias voltage;

a current source, coupling to the inverted input terminal of the operational amplifier and controlled by the control circuit to provide a reference current for discharging the first capacitor, wherein the reference current is larger than the second photocurrent;

a first multiplexer, selectively providing the bias voltage or the first threshold voltage as a first comparing reference signal; and a first comparator, comparing the first voltage with the first comparing reference signal and outputting a first comparing signal;

wherein the first capacitor is coupled between the inverted input terminal and the output terminal of the operational amplifier;

wherein the control circuit receives the first comparing signal and controls the integration/de-integration time of the first charge balancing ADC and the second charge balancing ADC.

10. The photo sensor according to claim 8, wherein the second charging balancing ADC further comprising:

an operational amplifier, having an inverted input terminal, an non-inverted input terminal and an output terminal, the non-inverted input terminal receiving the bias voltage;

a current source, coupling to the inverted input terminal of the operational amplifier and controlled by the control circuit to provide a reference current for charging the second capacitor, wherein the reference current is larger than the second photocurrent;

a second multiplexer, selectively providing the bias voltage or the second threshold voltage as a second comparing reference signal; and a second comparator, comparing the second voltage with the second comparing reference signal and outputting a second comparing signal;

wherein the second capacitor is coupled between the inverted input terminal and the output terminal of the operational amplifier;

wherein the control circuit receives the second comparing signal and controls the integration/de-integration time of the first charge balancing ADC and the second charge balancing ADC.

11. The photo sensor according to claim 8, further comprising:

a dark stacked photodiode structure, having the same structure as to the stacked photodiode structure and further comprising:

a metal cover, covering the dark stacked photodiode structure for preventing the visible light and IR light from entering the dark stacked photodiode structure;

wherein a dark anode terminal of the dark stacked photodiode structure is coupled to the anode terminal of the stacked photodiode structure, a dark cathode terminal of the dark stacked photodiode structure is coupled to the cathode terminal of the stacked photodiode structure.

12. The photo sensor according to claim 8, wherein the first-conductivity-type is p-type, and the second-conductive-type is n-type.

13. The photo sensor according to claim 8, wherein the first-conductivity-type is n-type, and the second-conductive-type is p-type.

* * * * *